(12) United States Patent
Choi

(10) Patent No.: US 8,523,606 B2
(45) Date of Patent: Sep. 3, 2013

(54) TEST SOCKET

(75) Inventor: Gui-Heum Choi, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/309,293

(22) Filed: Dec. 1, 2011

(65) Prior Publication Data

US 2012/0142203 A1   Jun. 7, 2012

(30) Foreign Application Priority Data

Dec. 2, 2010   (KR) .......................... 10-2010-0121729

(51) Int. Cl.
*H01R 13/62* (2006.01)
(52) U.S. Cl.
USPC .......................................... 439/526; 439/330
(58) Field of Classification Search
USPC ...................... 439/526, 525, 330, 331, 71, 73
See application file for complete search history.

(56) References Cited

U.S. PATENT DOCUMENTS

| | | | | |
|---|---|---|---|---|
| 3,409,861 A | * | 11/1968 | Barnes et al. | 439/331 |
| 5,088,930 A | * | 2/1992 | Murphy | 439/70 |
| 5,245,277 A | * | 9/1993 | Nguyen | 324/750.25 |
| 5,545,045 A | * | 8/1996 | Wakamatsu | 439/70 |
| 6,644,982 B1 | * | 11/2003 | Ondricek et al. | 439/73 |
| 6,877,993 B2 | * | 4/2005 | Palaniappa et al. | 439/73 |
| 7,654,862 B2 | * | 2/2010 | Liao et al. | 439/526 |
| 7,896,658 B2 | * | 3/2011 | Ikeda | 439/71 |
| 2008/0311769 A1 | | 12/2008 | Yamada et al. | |

FOREIGN PATENT DOCUMENTS

| | | |
|---|---|---|
| JP | 2010-157472 A | 7/2010 |
| KR | 20-0328984 Y1 | 10/2003 |
| KR | 10-2008-0082652 A | 9/2008 |
| KR | 10-2009-0077991 A | 7/2009 |

* cited by examiner

*Primary Examiner* — Gary F. Paumen
(74) *Attorney, Agent, or Firm* — Sughrue Mion, PLLC

(57) ABSTRACT

A test socket is provided including a socket board, socket pins and a guiding member. The socket pins are exposed to an upper surface of the socket board and are configured to be electrically contacted by external terminals of an object. The guiding member is disposed on an upper surface of the socket board and is arranged to guide the external terminals as a single unit to contact the external terminals with the socket pins. The guiding member is also configured to a center of the socket board with a center of the object.

20 Claims, 3 Drawing Sheets

TEST SOCKET

CROSS-RELATED APPLICATION

This application claims priority under 35 USC §119 from Korean Patent Application No. 2010-121729, filed on Dec. 2, 2010 in the Korean Intellectual Property Office (KIPO), the contents of which are herein incorporated by reference in their entirety.

BACKGROUND

1. Field

Apparatuses consistent with exemplary embodiments relate to a test socket, and more particularly, to a test socket for testing electrical characteristics of a semiconductor package.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages. Electrical characteristics of the semiconductor package may be tested using a socket.

The test socket may include a socket board, socket pins and a guiding member. The socket pins may be arranged on the socket board. The socket pins may make contact with external terminals of the semiconductor package. The guiding member may be arranged on the socket board. The guiding member may guide positions of the external terminals so as to contact the external terminals with the socket pins.

The guiding member may have a structure configured to independently guide the external terminals. However, the guiding member does not have a function for aligning a center of the semiconductor package with a center of the socket board. Thus, the alignment may require aligning an insert, which loads or unloads the semiconductor package onto or from the socket board, with the center of the socket board.

In order to align the centers of the insert and the socket board with each other, the insert for holding the semiconductor package may have a small inner clearance. With the small inner clearance, the semiconductor package may not be readily unloaded from the insert. In contrast, is the insert has a large inner clearance, the external terminals may not accurately make contact with the socket pins. These problems may grow more in proportion to a minute pitch of the external terminals.

SUMMARY

One or more exemplary embodiments provide a test socket capable of allowing external terminals of an object to accurately make contact with socket pins with being aligned with a center of the object.

According to an aspect of an exemplary embodiment, there is provided a test socket. The test socket may include a socket board, socket pins and a guiding member. The socket board may be configured to receive an object. The socket pins are exposed to an upper surface of the socket board and are configured to be electrically contacted by external terminals of an object. The guiding member is disposed on the upper surface of the socket board and is configured to the external terminals as a single unit to contact the external terminals with the socket pins and to align a center of the socket board with a center of the object.

The guiding member may be disposed on a central portion of the upper surface of the socket board and configured to make contact with inner surfaces of the external terminals.

The guiding member may be disposed on an edge portion of the upper surface of the socket board and configured to make contact with outer surfaces of the external terminals.

The guiding member may include an insulating film.

The test socket may further include a fixing member for fixing the guiding member to the socket board. The fixing member may include an adhesive, a screw, etc.

The socket pins may include conductive rubber pins, pogo pins, etc.

The object may include a semiconductor package.

Contact between the guiding member and the external terminals as a whole may allow a guiding of the external terminals to contact the socket pins and an alignment of a center of the object with a center of the socket board. Thus, because aligning the center of the socket board with a center of an insert is made unnecessary, the object may be stably loaded into the socket board and electrical contacts between the external terminals and the socket pins may be ensured.

BRIEF DESCRIPTION OF THE DRAWINGS

The above and/or other aspects will be more clearly understood from the following detailed description of exemplary embodiments taken in conjunction with the accompanying drawings in which:

FIG. 4 is a cross-sectional view illustrating the test socket of

DETAILED DESCRIPTION OF THE EMBODIMENTS

Figure 1:
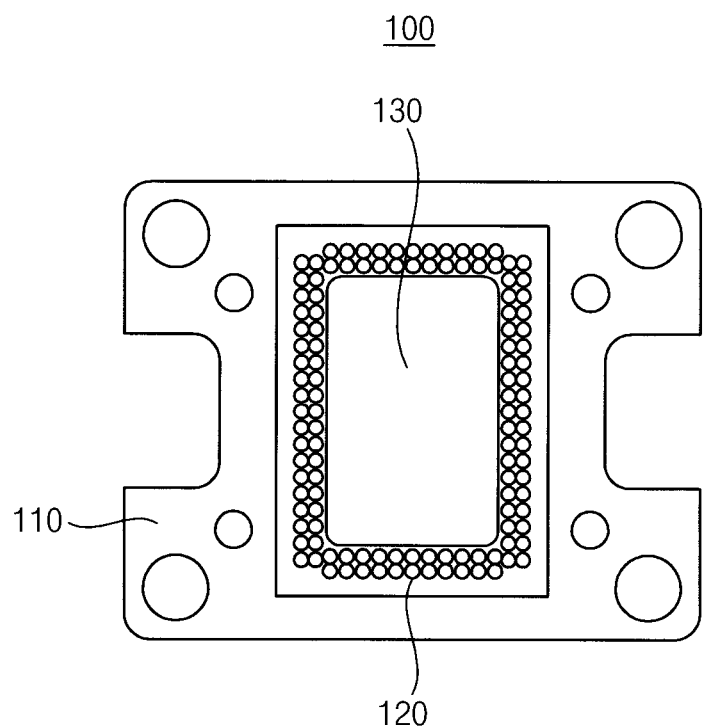
FIG. 1 is a plan view illustrating a test socket in accordance with an exemplary embodiment.

Exemplary embodiments will be described more fully hereinafter with reference to the accompanying drawings. Exemplary embodiments, however, may take many different forms and should not be construed as limited by the descriptions set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations. However, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the described embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring to FIG. 1, a test socket 100 according to an exemplary embodiment includes a socket board 110, socket pins 120 and a guiding member 130.

The socket board 110 may be configured to receive an object. The object may be a semiconductor package. The semiconductor package may include external terminals such as solder balls. The socket board 110 may include a test circuit (not shown). A test current may be applied to the external terminals of the semiconductor package through the test circuit to test electrical characteristics of the semiconductor package.

The socket pins 120 may be arranged on an upper surface of the socket board 110. The socket pins 120 may make contact with the external terminals of the semiconductor package one-to-one. Thus, the test current may be supplied to the external terminals of the semiconductor package via the test circuit and the socket pins 120.

According to one or more aspects of the embodiment, arrangements and positions of the socket pins 120 may correspond to those of the external terminals of the semiconductor package. The socket pins 120 may be arranged in two rows on an upper edge surface of the socket board 110.

Figure 2:
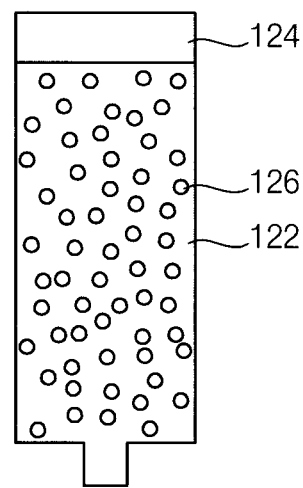
FIG. 2 is a cross-sectional view illustrating a conductive rubber pin of the test socket of FIG. 1.

According to one or more aspects of this embodiment, as shown in FIG. 2, the socket pin 120 may be a conductive rubber pin. The conductive rubber pin 120 may include a rubber body 122, a conductive contact head 124 and conductive particles 126. The rubber body 122 may be fixed to the upper surface of the socket board 110. The conductive contact head 124 may be attached to an upper surface of the rubber body 122. The conductive contact head 124 may make contact with the external terminals. The conductive particles 126 may be provided within the rubber body 122. When the conductive contact head 124 is compressed, as by an external terminal, the compressive force is transferred to the rubber body 122. The conductive particles 126 in the rubber body 122 may thereby become connected with each other, so that the rubber body 122 may be converted into a conductive member. The conductive contact head 124 may include gold.

Figure 3:
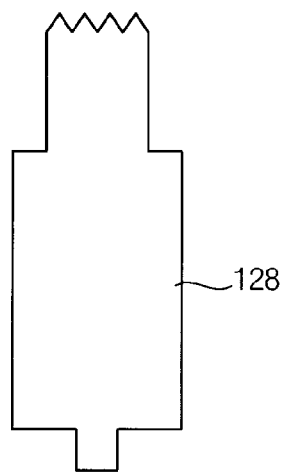
FIG. 3 is a cross-sectional view illustrating a pogo pin of a test socket in accordance with an exemplary embodiment.

According to one or more aspects of this embodiment, as shown in FIG. 3, the socket pin 120 may be a pogo pin 128. The pogo pin 128 may include a pin body and a gold layer (not shown) plated on the pin body. The pogo pin 128 may have an upper surface which is provided to make contact with the external terminal. The upper surface of the pogo pin 128 may have an uneven shape.

The guiding member 130 may be arranged on an upper central surface of the socket board 110. Thus, the guiding member 130 may be surrounded by the socket pins 120. The guiding member 130 may guide the external terminals of the semiconductor package to accurately contact the external terminals with the socket pins 120. According to one or more aspects of this embodiment, the guiding member 130 may guide positions of the external terminals as a whole, rather than independently positioning each of the external terminals. The guiding member 130 may make contact with inner surfaces of the external terminals to locate the external terminals on the socket pins 120.

Additionally, the guiding member 130 may align a center of the semiconductor package with a center of the socket board 110. The semiconductor package, provided in an insert, may be loaded onto the upper surface of the socket board 110, and the center of the semiconductor package may be naturally aligned with the center of the socket board 110 by contacting the inner surfaces of the external terminals with an outer surface of the guiding member 130. Therefore, it may not be required to closely manage an inner clearance of the insert for holding the semiconductor package. For example, although the inner clearance of the insert may be large, the center of the semiconductor package may be naturally aligned with the center of the socket board 110 by contacting the inner surfaces of the external terminals with the outer surface of the guiding member 130.

According to one or more aspects of this embodiment, the guiding member 130 may have a single member for guiding the external terminals of the semiconductor package as a whole. The guiding member 130 may have a plate shape. The guiding member 130 may include an insulating film.

Figure 4:
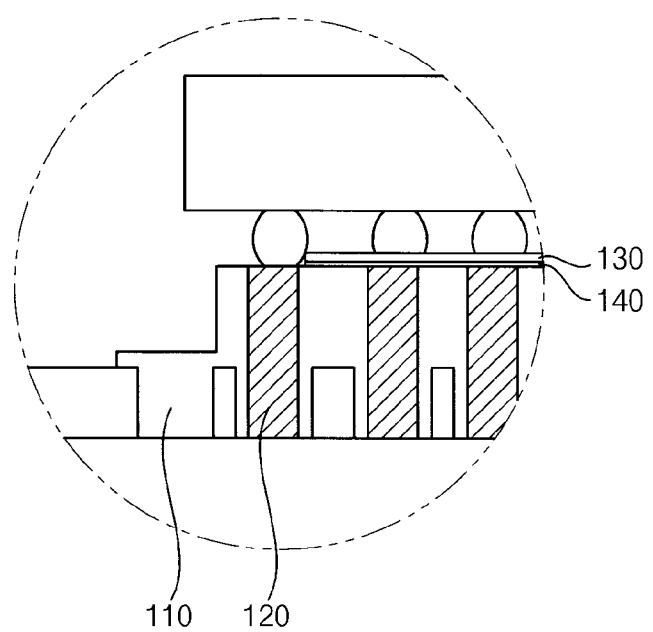

Referring to FIG. 4, the guiding member 130 may be attached to the upper surface of the socket board 110 using an adhesive 140.

Figure 5:
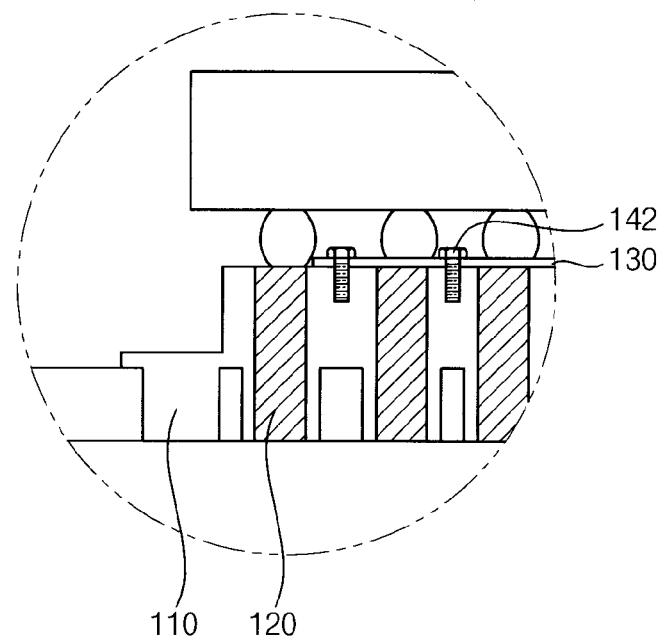
FIG. 5 is a cross-sectional view illustrating a test socket in accordance with an exemplary embodiment.

Alternatively, referring to FIG. 5, the guiding member 130 may be fixed to the upper surface of the socket board 110 using one or more screws 142.

The single guiding member may make contact with the inner surfaces of the external terminals of the semiconductor package, so that the contacts between the external terminals and the socket pins may be guided and the centers of the semiconductor package and the socket board may be aligned with each other. Thus, because aligning the center of the socket board with the center of the insert may be unnecessary, the semiconductor package may be stably loaded into the socket board and electrical contacts between the external terminals and the socket pins may be ensured.

Figure 6:
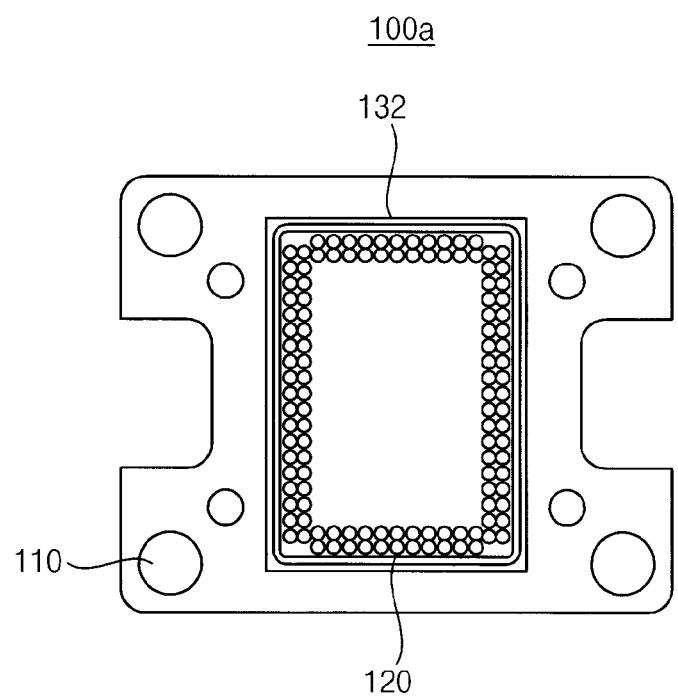
FIG. 6 is a cross-sectional view illustrating a test socket in accordance with another exemplary embodiment.

FIG. 6 is a cross-sectional view illustrating a test socket in accordance with another exemplary embodiment.

The test socket 100a of this embodiment may include one or more elements substantially the same as those of the test socket 100 except for a guiding member 132. Thus, the same reference numerals may refer to like elements, and any further illustrations with respect to the like elements may be omitted herein for brevity.

Referring to FIG. 6, the guiding member 132 may be arranged on the upper edge surface of the socket board 110. Thus, the guiding member 132 may have a rectangular frame shape configured to surround the socket pins 120.

According to one or more aspects of this embodiment, because the guiding member 132 may surround the socket pins 120, an inner surface of the guiding member 132 may make contact with outer surfaces of the external terminals of the semiconductor package. The guiding member 132 may allow accurate contacts between the external terminals and the socket pins 120 and a center alignment between the semiconductor package and the socket board 110.

The single guiding member may make contact with the outer surfaces of the external terminals of the semiconductor package, so that the contacts between the external terminals and the socket pins may be guided and the centers of the semiconductor package and the socket board may be aligned with each other. Thus, because aligning the center of the socket board with the center of the insert may be unnecessary, the semiconductor package may be stably loaded into the socket board and electrical contacts between the external terminals and the socket pins may be ensured.

According to one or more aspects of this embodiment, the guiding member may be positioned within an arrangement of the socket pins or may surround the socket pins. Alternatively, the arrangements and the positions of the guiding member may vary in accordance with the external terminals of the semiconductor package.

As described above, the object with which the test socket is used may be the semiconductor package. Alternatively, the test socket may be used for testing other electrical devices having external terminals.

According to an aspect of one or more exemplary embodiments, the single guiding member may make contact with the external terminals of the semiconductor package as a whole, so that the contacts between the external terminals and the socket pins may be guided and the centers of the semiconductor package and the socket board may be aligned with each other. Thus, because aligning the center of the socket board with the center of the insert may be unnecessary, the semiconductor package may be stably loaded into the socket board and electrical contacts between the external terminals and the socket pins may be ensured.

The foregoing description of exemplary embodiments is not to be construed as limiting thereof. Although a few exemplary embodiments have been described, those skilled in the art will readily appreciate that many modifications are possible to the exemplary embodiments. Accordingly, all such modifications are intended to be included within the scope of the modifications to the described exemplary embodiments, as well as other exemplary embodiments, are intended to be included within the scope of the appended claims.

What is claimed is:

1. A test socket comprising:
   a socket board;
   socket pins exposed to an upper surface of the socket board and configured to be electrically contacted by solder balls of an object; and
   a guiding member disposed on the upper surface of the socket board, the guiding member configured in a shape to guide the solder balls of the object to contact the socket pins,
   wherein the solder balls are located under the object and the guiding member is configured to contact inner surfaces of the solder balls.

2. The test socket of claim 1, wherein a cross-sectional width of the guiding member is less than a corresponding width between two socket pins disposed at opposite sides of the guiding member.

3. The test socket of claim 2, wherein the guiding member comprises an insulating film.

4. The test socket of claim 2, further comprising a fixing member which fixes the guiding member to the socket board.

5. The test socket of claim 4, wherein the fixing member comprises an adhesive.

6. The test socket of claim 4, wherein the fixing member comprises a screw.

7. The test socket of claim 2, wherein the socket pins comprise conductive rubber pins.

8. The test socket of claim 2, wherein the socket pins comprise pogo pins.

9. The test socket of claim 2, wherein the socket pins are disposed in a rectangular frame shape that surrounds the guiding member.

10. The test socket of claim 2, wherein the socket pins are disposed in a substantially closed shape that surround the guiding member and form an interior region, and
   wherein the shape of the guiding member substantially matches a shape of the interior region.

11. The test socket of claim 1, wherein the socket pins are arranged in more than one row.

12. A test socket comprising:
   a socket board;
   socket pins exposed to an upper surface of the socket board and configured to be electrically contacted by solder balls of an object; and
   a guiding member disposed on the upper surface of the socket board, the guiding member configured to guide the solder balls of the object to contact the socket pins,
   wherein the solder balls are located under the object and the guiding member is configured to contact outer surfaces of the solder balls.

13. The test socket of claim 12, wherein the socket pins are surrounded by the guide member.

14. The test socket of claim 12, wherein the socket pins are arranged in more than one row.

15. The test socket of claim 14, wherein the guiding member comprises an insulating film.

16. The test socket of claim 14, further comprising a fixing member which fixes the guiding member to the socket board.

17. The test socket of claim 16, wherein the fixing member comprises an adhesive.

18. The test socket of claim 16, wherein the fixing member comprises a screw.

19. The test socket of claim 14, wherein the socket pins comprise conductive rubber pins.

20. The test socket of claim 14, wherein the socket pins comprise pogo pins.

\* \* \* \* \*